United States Patent [19]
Kakehashi

[11] Patent Number: 6,040,242
[45] Date of Patent: *Mar. 21, 2000

[54] METHOD OF MANUFACTURING A CONTACT PLUG

[75] Inventor: Eiichirou Kakehashi, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/804,352

[22] Filed: Feb. 21, 1997

[30] Foreign Application Priority Data

Feb. 28, 1996 [JP] Japan ................................. 8-041164

[51] Int. Cl.$^7$ ................................................. H01L 21/28
[52] U.S. Cl. ...................... 438/672; 438/629; 438/639; 438/738
[58] Field of Search .................................. 438/597, 622, 438/629, 633, 637, 639, 647, 657, 669, 672, 712, 719, 735, 738, 739, 742, 705

[56] References Cited

U.S. PATENT DOCUMENTS

| | | | |
|---|---|---|---|
| 4,936,950 | 6/1990 | Doan et al. | 438/634 |
| 4,981,550 | 1/1991 | Huttemann et al. | 438/672 |
| 5,279,990 | 1/1994 | Sun et al. | 438/672 |
| 5,587,338 | 12/1996 | Tseng | 438/672 |
| 5,786,637 | 7/1998 | Tabara | 257/758 |

FOREIGN PATENT DOCUMENTS 63-181356  7/1988  Japan .......................... 438/FOR 351

OTHER PUBLICATIONS

Wolf, S., Silicon Processing for the VLSI Era, vol. 1, 1986, Lattice Press, pp. 555–557, 581–582.

*Primary Examiner*—T. N. Quach
*Attorney, Agent, or Firm*—Hayes Soloway Hennessey Grossman & Hage, PC

[57] ABSTRACT

There is provided a method of manufacturing a semiconductor device, comprising steps of forming an insulating film on a semiconductor substrate; forming a first film of a first material to cover the insulating film; forming a contact-hole through the insulating film and the first film so that the semiconductor substrate is exposed in a bottom of the contact hole; forming a second film of a second material to fill the contact hole and cover the first film; and, removing the first film and the second film in an area other than the contact hole, wherein the first film is etched at a greater etching rate than that of the second film to form a buried contact plug comprising a part of the second film. The semiconductor device thus obtained has no plug loss. The use of a spacer layer to form a contact hoe by selective etching is also shown.

17 Claims, 5 Drawing Sheets

METHOD OF MANUFACTURING A CONTACT PLUG

BACKGROUND OF THE INVENTION

1. Field of the Invention

The present invention relates to a method of manufacturing a semiconductor device, and particularly to a method of manufacturing a semiconductor device having a contact plug for wiring.

2. Description of the Related Art

Recently, in a semiconductor device, a contact hole has become miniaturized due to high integration, and it has been used a method for manufacturing such a semiconductor device in which a contact plug is formed by burying an electrically conductive material in the contact hole. Such a conventional method is conducted, for example, as follows.

First, as shown in FIG. 1A, a field oxide insulating film 302 is formed on a silicon substrate 301, and an $n^+$-type diffusion layer 303 doped with arsenic, etc. is formed on the substrate 301 in a selected area.

Next, as shown in FIG. 1B, on the substrate processed as in the above, an inter-layer insulating film 304 of silicon oxide and a patterned photoresist film 305 are formed in this order, and then a contact hole 306 is formed through the insulating film 304 by means of a photolithography and etching processes using the photoresist film 305 as a mask to expose the $n^+$-type diffusion layer 303. Thus, the contact hole 306 reaches the $n^+$-type diffusion layer 303.

Next, as shown in FIG. 1C, a polysilicon film 307 is deposited in the contact hole 306 and on the insulating film 304.

Next, an etching process is conducted to remove the polysilicon film 307 on the insulating film 304 and to leave the polysilicon film 307 in the contact hole 306. Thus, a contact plug 308 is formed in the contact hole 306 as shown in FIG. 1D.

Next, the contact plug 308 is doped with phosphorus by means of an ion implantation process, and a tungsten silicide ($WSi_x$) film 309 is formed and patterned to form a wiring which is in contact with the contact plug 308.

A drawback of the above conventional method is an occurrence of "plug loss", in that the contact hole 306 is not completely filled by the plug 308. The reason is that, when conducting the etching process of the polysilicon film 307 to form the contact plug 308, an over etching is necessary in order to avoid the polysilicon film 307 to be left on the insulating film 304 and therefore, the polysilicon film 307 in the contact hole 306 is also etched in some extent. If a depth of the contact hole 306 is small, the substrate 301 is in danger of etching.

A further drawback of the conventional method is that an upper layer wiring becomes in danger of occurence of defects such as disconnection. The reason is that, when there is the plug loss, a step coverage of the upper layer wiring in contact with the contact plug 308 is lowered.

SUMMARY OF THE INVENTION

An object of the present invention is to provide a method of manufacturing a semiconductor device having a contact plug without causing the plug loss.

In order to attain the above object, according to the present invention, there is provided a method of manufacturing a semiconductor device, comprising:

a first step of forming an insulating film on a semiconductor substrate;

a second step of forming a first film of a first material to cover the insulating film;

a third step of forming a contact hole through the insulating film and the first film so that the semiconductor substrate is exposed in a bottom of the contact hole;

a fourth step of forming a second film of a second material to fill the contact hole and cover the first film;

a fifth step of removing the first film and the second film in an area other than the contact hole, wherein the first film is etched at a greater etching rate than that of the second film to form a buried contact plug comprising a part of the second film.

In this method, only the second film is formed in the contact hole, while the first and second films are formed on the insulating film. Therefore, a level of the top of the contact plug, i.e. the remaining second film, can be equal to or higher than a level of the insulating film when the first and second films on the insulating film are completely removed, because the second film is etched at a smaller etching rate than that of the first film.

The second material may comprise polysilicon and the first material may comprise polysilicon doped with phosphorus or arsenic at a concentration greater than that of the second material, and, the fifth step may be conducted by reactive ion etching process using a gas containing fluorine or chlorine.

The first material may comprise silicon, the second material may comprise $WSi_x$ ($0<x<3$), and, the fifth step may be conducted by reactive ion etching process using a gas containing fluorine.

The method may further comprise a step of impurity doping to the buried contact plug to enhance an electrical conductivity thereof.

The method may further comprise a step of forming a wiring connected to the buried contact plug.

Furthermore, in order to attain the above object, according to the present invention, there is provided a method of manufacturing a semiconductor device, comprising:

a first step of forming a first insulating film on a semiconductor substrate;

a second step of forming a first film which can be etched selectively to the first insulating film, and of forming a second insulating film on the first film;

a third step of forming an opening which reaches the first insulating film in an area where a contact hole is to be formed;

a fourth step of forming a spacer on a side surface of the opening;

a fifth step of forming the contact hole which reaches the semiconductor substrate by etching the second insulating film and the first insulating film selectively to the spacer and the first film;

a sixth step of forming a second film to fill the contact hole and cover the first film and the spacer;

a seventh step of forming a buried contact plug filling the contact hole by etching the second film, the spacer and the first film to expose the first insulating film.

In this method, it is possible to form the spacer on the inner side surface of the opening, a level of the top of the spacer being higher than a level of the first film. The second film is formed in the contact hole and on the spacer and the first film. Therefore, a level of the top of the contact plug, i.e. the remaining second film, can be equal to or higher than a level of the first insulating film, when the first and second films on the first insulating film are completely removed.

The spacer and the second film may comprise doped silicon or $WSi_y$ ($0 \leq y < 3$).

The method may further comprise a step of forming a wiring connected to the buried contact plug.

The first film, spacer and the second film each may be electrically conductive.

The first film, spacer and the second film each may capable of becoming electrically conductive by impurity doping or heat treatment, and, further step of impurity doping or heat treatment may be conducted on the first film, spacer and the second film, respectively.

According to the present invention, the contact plug without plug loss can be formed and therefore, the semiconductor device having no disconnection of the wiring can be provided with good yield to realize an excellent reliability of the semiconductor device.

DETAILED DESCRIPTION OF THE PREFERRED EMBODIMENTS

A first embodiment according to the present invention will be explained hereunder with reference to FIGS. 2A to 2F.

Figure 1A:
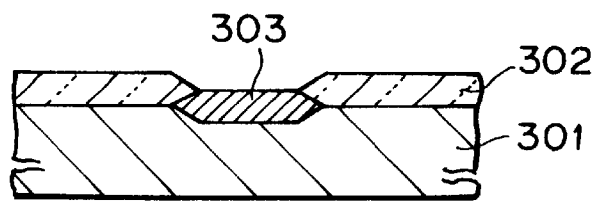
FIGS. 1A to 1E are each cross-sectional view for explaining a conventional method of manufacturing a semiconductor device having a contact plug.
Figure 1B:
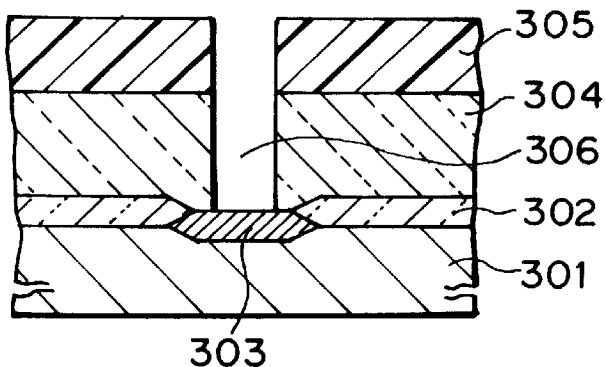
Figure 1C:
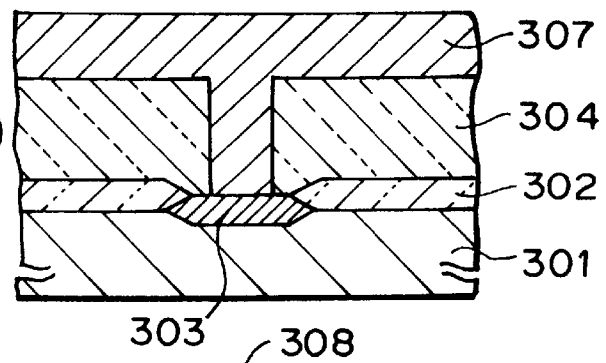
Figure 1D:
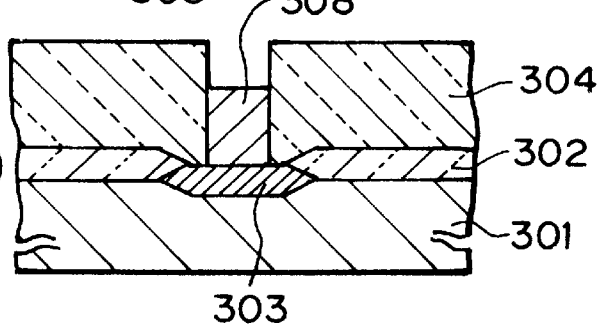
Figure 1E:
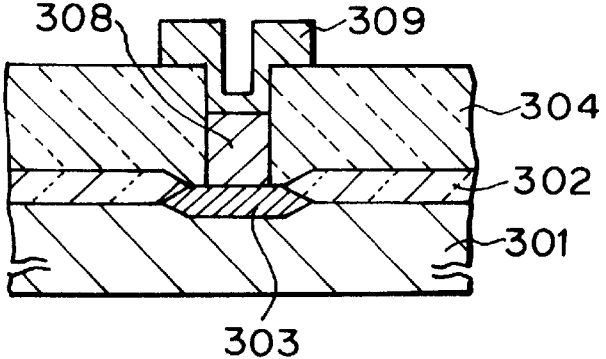
Figure 2A:
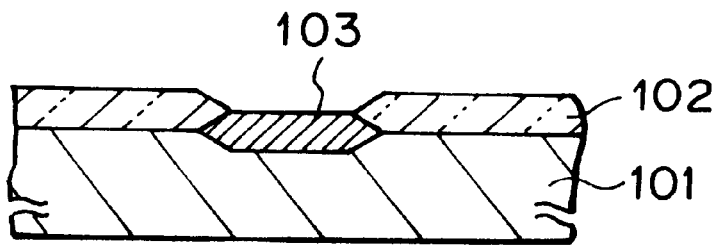
FIGS. 2A to 2F are each cross-sectional view for explaining a first embodiment of a method of manufacturing a semiconductor device according to the present invention.

First, as shown in FIG. 2A, a field oxide insulating film 102 is formed on a silicon substrate 101, and an n⁺-type diffusion layer 103 doped with arsenic, phosphorus, etc. is formed on the substrate 101 in a predetermined area, in the same manner as the above-mentioned conventional method. The n⁺-type diffusion layer 103 is, for example, a source or drain region of MOS transistor.

Figure 2B:
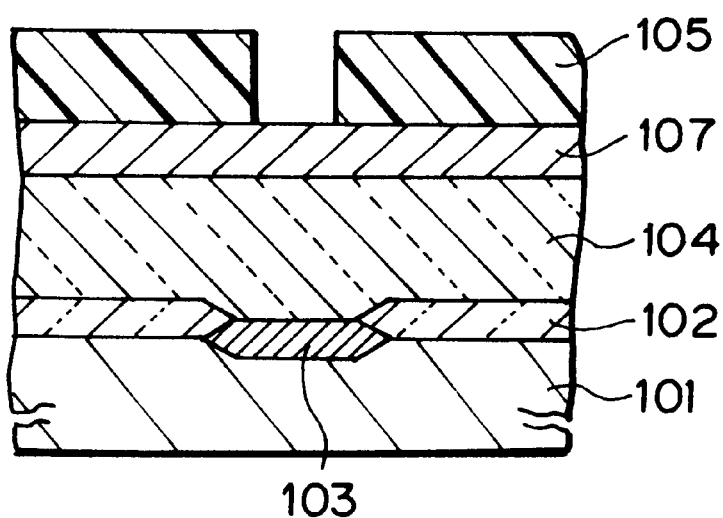
Figure 2C:
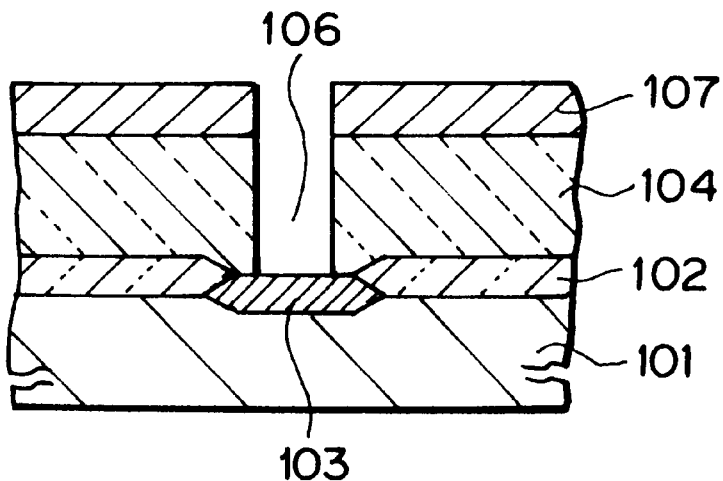

Next, as shown in FIG. 2B, an inter-layer insulating film 104 of silicon oxide is formed in the same manner as the above-mentioned conventional method. Then, a first polysilicon film 107 doped with phosphorus or arsenic at a concentration of $10^{19}$ cm$^{-3}$ or more is formed on the insulating film 104. Then, a patterned photoresist film 105 is formed by means of photolithography process and, as shown in FIG. 2C, an etching process is conducted on the first polysilicon film 107 and the insulating film 104 by using the patterned photoresist film 105 as a mask to form a contact hole 106 having a diameter of for example 0.3 μm and a depth of for example about 1 μm so as to expose the n⁺-type diffusion layer 103 within the contact hole 106. Thus, the contact hole 106 reaches the n⁺-type diffusion layer 103. Then, the photoresist film 105 is removed.

Figure 2D:
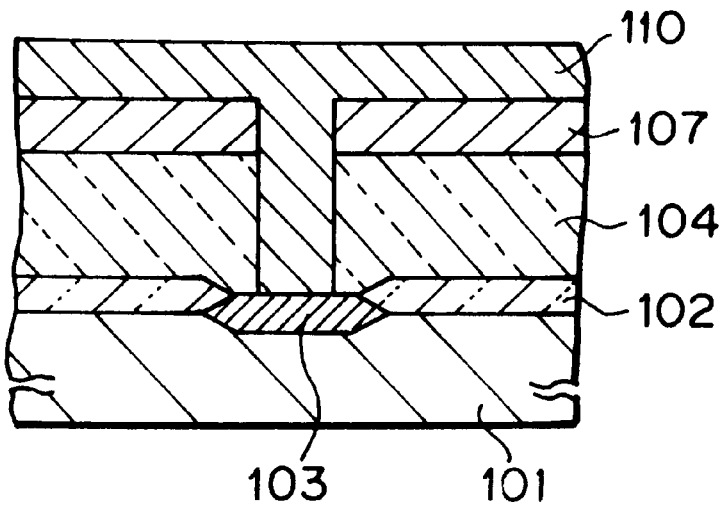

Next, as shown in FIG. 2D, on the substrate processed as in theabove, a non-doped second polysilicon film 110 is formed by low pressure CVD process at a substrate temperature of 630° C. to fill the contact, hole 106 with the second polysilicon film 110 and cover the first polysilicon film 107. Here, a thickness of the second polysilicon film 110 is greater than a radius of the contact hole 106.

Figure 2E:
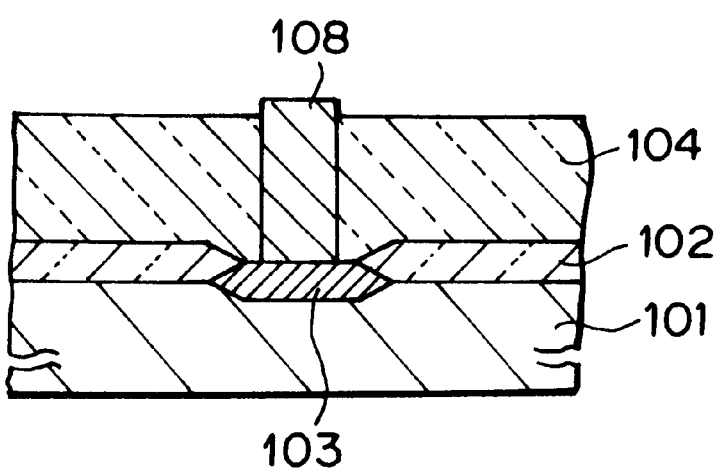

Then, the first polysilicon film 107 and the second polysilicon film 110 are etched by a reactive ion etching process using a gas containing fluorine such as $SF_6$. In such an etching process, the first polysilicon film 107 is etched faster than the second polysilicon film 110, since, when using the gas containing fluorine such as $SF_6$, an etching rate on a polysilicon film doped with phosphorus, arsenic, etc. is greater than that on a non-doped polysilicon film. Accordingly, as shown in FIG. 2E, a buried plug 108 comprising a part of the second polysilicon film 110 is formed without causing the plug loss. Thereafter, phosphorus ion implantation process is conducted to enhance a conductivity of the buried plug 108 to obtain an electrically conductive buried plug, i.e. contact plug 108a.

Figure 2F:
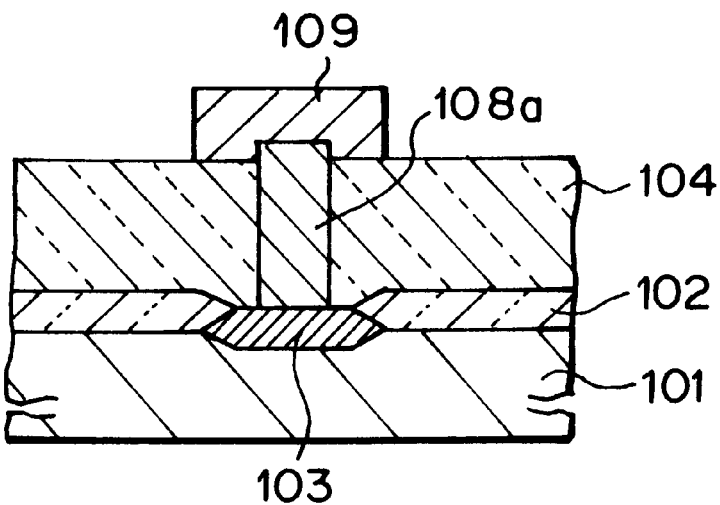

Next, as shown in FIG. 2F, $WSi_x$ (x≈2) film 109 is deposited and patterned to form a wiring. Thus, contact-wiring structure is formed.

In the above first embodiment, an amorphous silicon film doped with impurity or non-doped may be formed by means of CVD process instead of the first polysilicon film, and, $WSi_x$ (0<x<3) may be used instead of the second polysilicon film. The etching of silicon may be conducted by a reactive ion etching process using a gas containing chlorine such as $Cl_2$ instead of the gas containing fluorine such as $SF_6$. The amorphous silicon film is converted to polysilicon film by means of a heat treatment of 600–800° C. prior to or after the etching process. The heat treatment may be conducted as serving also a deposition/reflowing heat treatment of the interlayer insulating film such as BPSG film.

Next, a second embodiment according to the present invention will be explained hereunder with reference to FIGS. 3A to 3G.

Figure 3A:
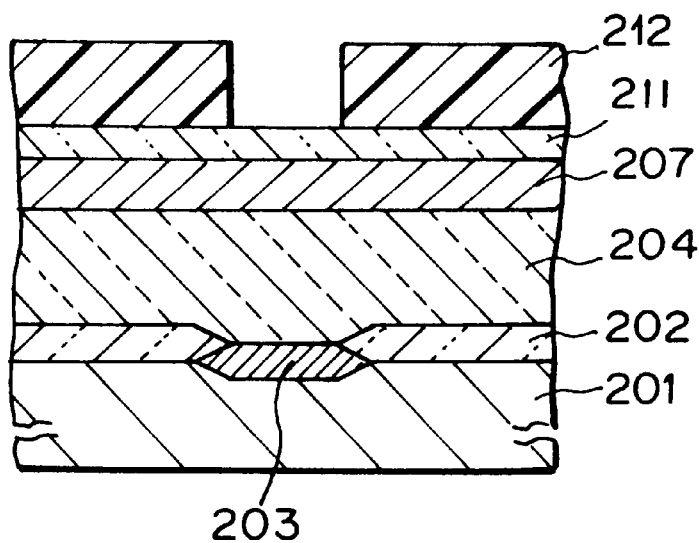
FIGS. 3A to 3G are each cross-sectional view for explaining a second embodiment of a method of manufacturing a semiconductor device according to the present invention.

First, as shown in FIG. 3A, on a silicon substrate 201, a field oxide insulating film 202, an n⁺-type diffusion layer 203 doped with arsenic, phosphorus, etc., an inter-layer insulating film 204 of silicon oxide and an n-type doped first silicon film 207 is formed in the same manner as the above-mentioned first embodiment. Then, a silicon oxide film 211 is formed on the first silicon film 207 and, a patterned photoresist film 212 is formed on the silicon oxide film 211.

Figure 3B:
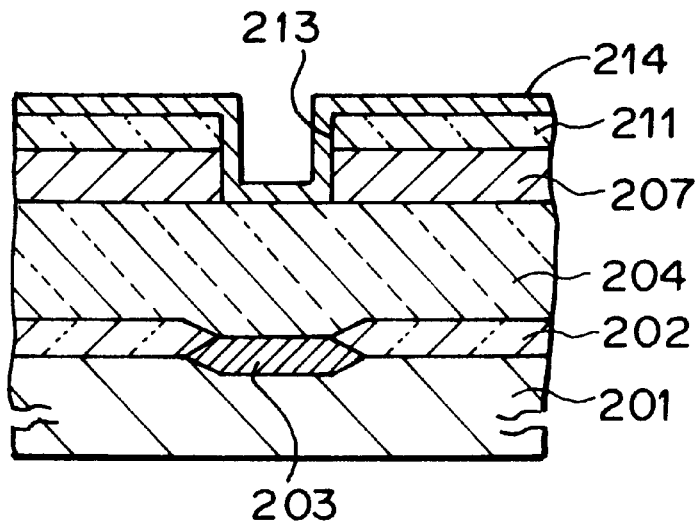
Figure 3C:
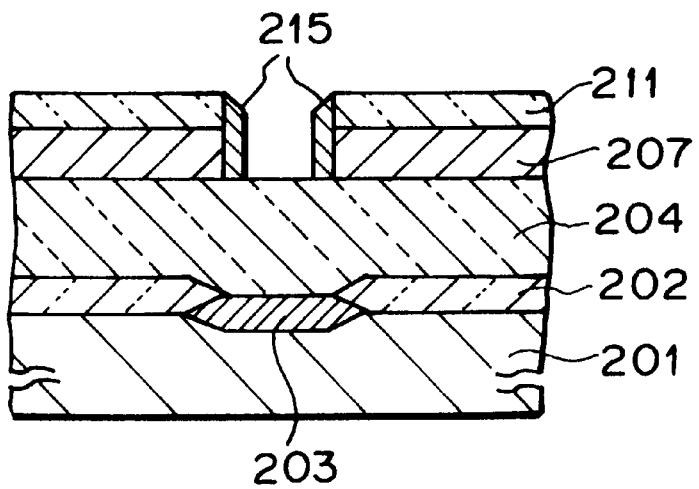
Figure 3D:
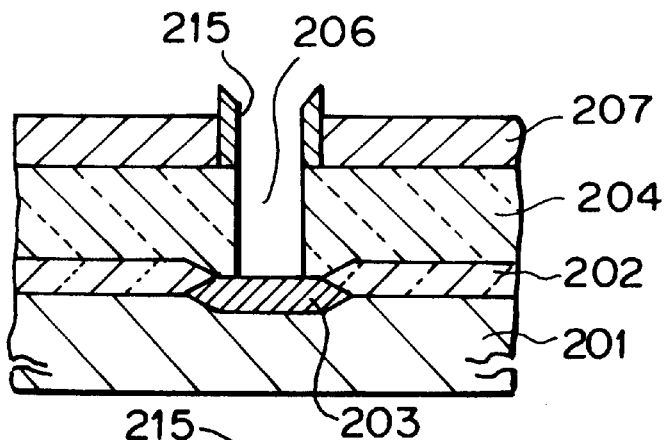

Next, as shown in FIG. 3B, an opening 213 is formed through the first silicon film 207 and the silicon oxide film 211 in an area where a contact hole will be formed. Then, an n-type doped second silicon film 214 is formed in such a thickness as not to completely fill the opening 213. Thereafter, an anisotropic etching process is conducted to form an electrically conductive spacer 215 comprising a part of the second silicon film 214 on the side surface of the opening 213 as shown in FIG. 3C.

Next, an etching process is conducted on the insulating film 204 by using the first silicon film 207 and the spacer 215 as a mask to form a contact hole 206. The etching is a reactive ion etching process using a gas containing a fluorine such as $CF_4$, etc. which can selectively remove the silicon oxide insulating film to the doped silicon film.

Figure 3E:
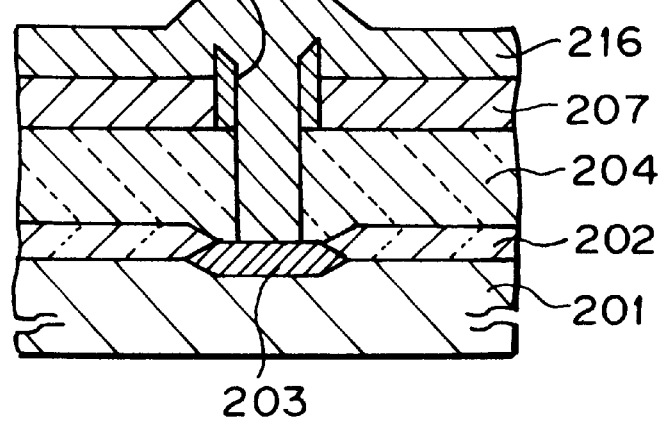

Next, as shown in FIG. 3E, an n-type doped second silicon film 216 is formed. A level of the surface of the second silicon film 216 at the contact hole 206 and the neighborhood thereof becomes higher than that of the other area due to the spacer 215 protruding upwardly from a level of the first silicon film 207.

Figure 3F:
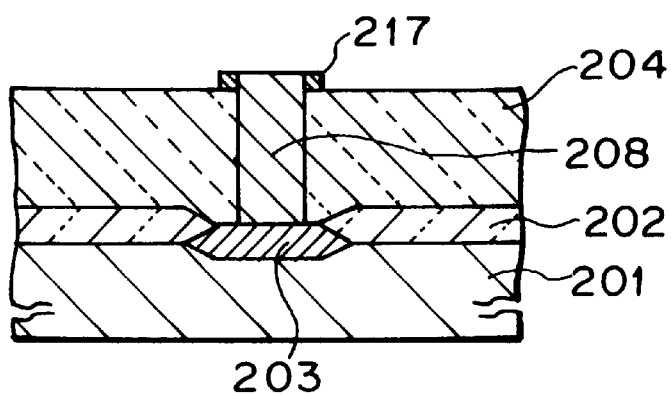

Next, as shown in FIG. 3F, the first silicon film 207 and the second silicon film 216 are etched at the entire area to form a contact plug 208. Since the level of the surface of the second silicon film 216 is higher at the contact hole 206 and the neighborhood thereof as mentioned in the above, a level of the top of the contact plug (buried plug) 208 is equal to or higher than a level of the insulating film 204 when the surface of the insulating film 204 is exposed. That is, the plug loss does not occur. A spacer ring 217 comprising a part of the spacer 215 can be left around the top portion of the contact plug 208.

Figure 3G:
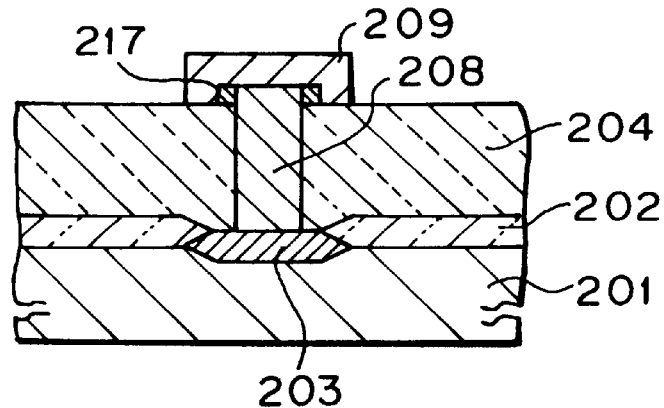

Then, as shown in FIG. 3G, a wiring comprising WSi$_x$ film 209 is formed.

According to the above second embodiment, it is possible to form the contact hole 206 having a diameter smaller by the spacer 215 than the minimum diameter of the opening 213 due to the restriction on the lithography process.

The silicon films 207, 214 and 216 may be a polysilicon film or an amorphous silicon film formed by CVD process. The amorphous silicon film is converted to the polysilicon film by the heat treatment as mentioned in the above. Instead of the silicon film, any electrically conductive film such as WSi$_y$ ($0 \leq y < 3$, for example y≈2) may be used.

What is claimed is:

1. A method of manufacturing a semiconductor device, comprising:
    a first step of forming an insulating film on a semiconductor substrate;
    a second step of forming a first film comprising silicon to cover said insulating film;
    a third step of forming a contact hole having a desired radius through said insulating film and said first film so that said semiconductor substrate is exposed in a bottom of said contact hole;
    a fourth step of forming a second film comprising WSi$_x$ ($0<x<3$) to fill said contact hole and cover said first film, wherein the second film has a thickness which is greater than the radius of said contact hole;
    a fifth step of removing said first film and said second film in an area other than said contact hole, wherein said first film is etched at a greater etching rate than that of said second film to form a buried contact plug comprising a part of said second film.

2. The method of manufacturing a semiconductor device as set forth in claim 1, wherein said first film comprises polysilicon, and, said fifth step is conducted by reactive ion etching process using a gas containing fluorine or chlorine.

3. The method of manufacturing a semiconductor device as set forth in claim 1, wherein said fifth step is conducted by a reactive ion etching process using a gas containing fluorine.

4. The method of manufacturing a semiconductor device as set forth in claim 1, further comprising a step of impurity doping to said buried contact plug to enhance an electrical conductivity thereof.

5. The method of manufacturing a semiconductor device as set forth in claim 1, further comprising a step of forming a wiring connected to said buried contact plug.

6. A method of manufacturing a semiconductor device, comprising:
    a first step of forming a first insulating film on a semiconductor substrate;
    a second step of forming a first film which can be selectively etched to said first insulating film, and of forming a second insulating film on said first film;
    a third step of forming an opening which reaches said first insulating film in an area where a contact hole is to be formed;
    a fourth step of forming a spacer on a side surface of said opening;
    a fifth step of forming said contact hole which reaches said semiconductor substrate by selectively etching said second insulating film and said first insulating film to said spacer and said first film;
    a sixth step of forming a second film to fill said contact hole and cover said first film and said spacer;
    a seventh step of forming a buried contact plug filling said contact hole by etching said second film, said spacer and said first film to expose said first insulating film.

7. The method of manufacturing a semiconductor device as set forth in claim 6, wherein said first film, said spacer and said second film comprise doped silicon or WSi$_y$ ($0 \leq y < 3$).

8. The method of manufacturing a semiconductor device as set forth in claim 6, further comprising a step of forming a wiring connected to said buried contact plug.

9. The method of manufacturing a semiconductor device as set forth in claim 6, wherein said first film is electrically conductive.

10. The method of manufacturing a semiconductor device as set forth in claim 6, wherein said first film is capable of becoming electrically conductive by impurity doping or heat treatment, and, a further step of impurity doping or heat treatment is conducted on said first film.

11. The method of manufacturing a semiconductor device as set forth in claim 6, wherein said spacer is electrically conductive.

12. The method of manufacturing a semiconductor device as set forth in claim 6, wherein said spacer is capable of becoming electrically conductive by impurity doping or heat treatment, and, a further step of impurity doping or heat treatment is conducted on said spacer.

13. The method of manufacturing a semiconductor device as set forth in claim 6, wherein said second film is electrically conductive.

14. The method of manufacturing a semiconductor device as set forth in claim 6, wherein said second film is capable of becoming electrically conductive by impurity doping or heat treatment, and, a further step of impurity doping or heat treatment is conducted on said second film.

15. A method of manufacturing a semiconductor device, comprising:
    a first step of forming an insulating film on a semiconductor substrate;
    a second step of forming a first film comprising silicon to cover said insulating film;
    a third step of forming a contact hole through said insulating film and said first film so that said semiconductor substrate is exposed in a bottom of said contact hole;
    a fourth step of forming a second film comprising WSi$_x$ ($0<x<3$) to fill said contact hole and cover said first film;
    a fifth step of removing said first film and said second film in an area other than said contact hole, by a reactive ion etching process using a gas containing fluorine, wherein said first film is etched at a greater etching rate than that of said second film to form a buried contact plug comprising a part of said second film.

16. The method of manufacturing a semiconductor device as set forth in claim 15, further comprising a step of impurity doping to said buried contact plug to enhance i an electrical conductivity thereof.

17. The method of manufacturing a semiconductor device as set forth in claim 15, further comprising a step of forming a wiring connected to said buried contact plug.

* * * * *

UNITED STATES PATENT AND TRADEMARK OFFICE
CERTIFICATE OF CORRECTION

PATENT NO. : 6,040,242
DATED : March 21, 2000
INVENTOR(S) : Eiichiro Kakehashi

Page 1 of 1

It is certified that error appears in the above-identified patent and that said Letters Patent is hereby corrected as shown below:

Claim 16, Col. 6, Line 59, please delete "i"

Signed and Sealed this

Fifth Day of June, 2001

Attest:

NICHOLAS P. GODICI

Attesting Officer

Acting Director of the United States Patent and Trademark Office